US009886543B2

(12) United States Patent
Chung et al.

(10) Patent No.: US 9,886,543 B2
(45) Date of Patent: Feb. 6, 2018

(54) METHOD PROVIDING FOR ASYMMETRIC PUPIL CONFIGURATION FOR AN EXTREME ULTRAVIOLET LITHOGRAPHY PROCESS

(71) Applicant: Taiwan Semiconductor Manufacturing Company, Ltd., Hsin-Chu (TW)

(72) Inventors: Chia-Chun Chung, Taoyuan County (TW); Norman Chen, Hsinchu (TW); Chih-Tsung Shih, Hsinchu (TW); Jeng-Horng Chen, Hsinchu (TW); Shinn-Sheng Yu, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/040,049

(22) Filed: Feb. 10, 2016

(65) Prior Publication Data
US 2017/0228490 A1 Aug. 10, 2017

(51) Int. Cl.
*G06F 17/50* (2006.01)
*G03F 1/24* (2012.01)

(52) U.S. Cl.
CPC ............ *G06F 17/5081* (2013.01); *G03F 1/24* (2013.01)

(58) Field of Classification Search
CPC .................... G06F 17/5081; G06F 2217/12
USPC .................................................. 716/53
See application file for complete search history.

(56) References Cited

U.S. PATENT DOCUMENTS

| 8,628,897 | B1 | 1/2014 | Lu et al. |
|---|---|---|---|
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |

(Continued)

OTHER PUBLICATIONS

Hsu, Stephen et al. "EUV Resolution enhancement Techniques (RETs) for $k_1$ 0.4 and below" Proc. of SPIE, 2015, pp. 94221I-1 to 94221I-16, vol. 9422.

(Continued)

*Primary Examiner* — Suchin Parihar
(74) *Attorney, Agent, or Firm* — Haynes and Boone, LLP

(57) ABSTRACT

A pattern of features of an integrated circuit is provided. A configuration of a pupil of an extreme ultraviolet wavelength radiation beam (also referred to as an illumination mode), is selected. The selected configuration is an asymmetric, single pole configuration. At least one disparity is determined between a simulated imaging using the selected configuration and a designed imaging for the pattern of features. A parameter (also referred to as a compensation parameter) is then modified to address the at least one disparity, wherein the parameter at least one a design feature, a mask feature, and a lithography process parameter. A substrate is then exposed to the pattern of features using the selected configuration and the modified parameter.

20 Claims, 17 Drawing Sheets

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 2006/0126046 A1* | 6/2006 | Hansen .................. G03F 7/705 355/55 |
| 2007/0053576 A1* | 3/2007 | Neureuther ............... G03F 1/30 382/144 |
| 2008/0241714 A1* | 10/2008 | Chang .................... G03B 27/28 430/30 |
| 2012/0013882 A1 | 1/2012 | Loopstra et al. |
| 2013/0083306 A1* | 4/2013 | Smirnov ............. G03F 7/70633 355/67 |
| 2016/0291482 A1* | 10/2016 | Shih ................... G03F 7/70641 |

OTHER PUBLICATIONS

Goldberg, Kenneth A. et al., "The SEMATECH high-NA actinic reticle review project (SHARP) EUV mask-imaging microscope", BACKUS News, Nov. 2013, pp. 1-11, vol. 29, Issue 11, SPIE, Bellingham, WA.

* cited by examiner

METHOD PROVIDING FOR ASYMMETRIC PUPIL CONFIGURATION FOR AN EXTREME ULTRAVIOLET LITHOGRAPHY PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region. EUV scanners provide the desired pattern on an absorption layer ("EUV" mask absorber) formed on a reflective mask. For EUV radiation, all materials are highly absorbing. Thus, reflective optics rather than refractive optics is used; a reflective mask is also used. It is desired to perform an EUV process with higher image contrast, while accurately reflecting the design requirements including pattern placement on the target substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
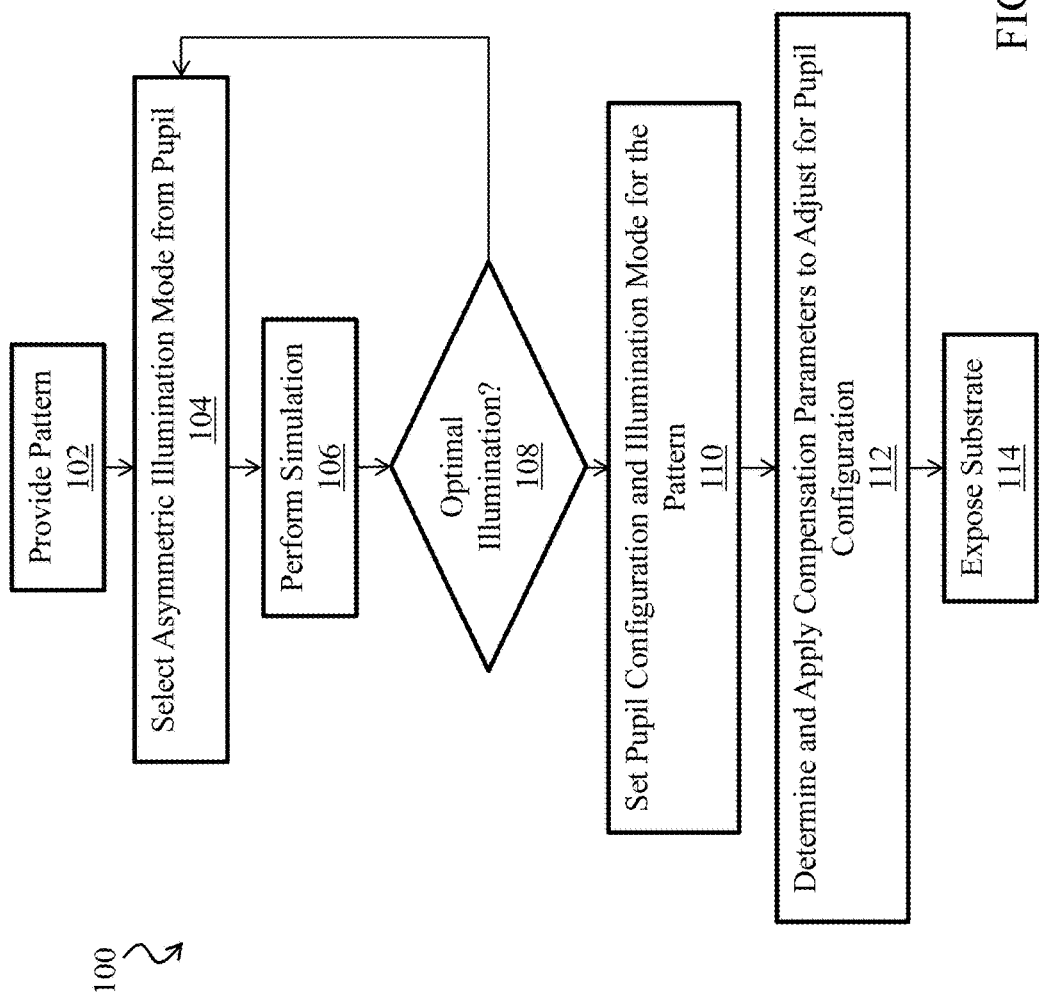
FIG. 1 is a flowchart of a lithography process according to aspects of the present disclosure in various embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, illustrated is a method 100 for performing a lithography process to image a pattern on a substrate. It is noted that the method 100 includes steps to image the pattern onto the substrate, but in other embodiments, this is step is not required. For example, embodiments of the method 100 may determine lithography and/or design parameters or features associated with a pattern, these parameters may be stored or otherwise preserved for later implementation in an imaging process. Similarly, the method 100 may include other steps not specifically illustrated herein; and/or the steps illustrated may be performed in a different order than specifically recited in the flow chart of the method 100.

The method 100 may be used to determine parameters and/or perform lithography using said parameters for a semiconductor device such as an integrated circuit (IC).

However, those skilled in the art would recognize other devices may also benefit from the present disclosure and are within the scope of the disclosure such as, light emitting diodes (LED), micro-electromechanical systems (MEMS), and/or other devices including or not including ICs.

The method 100 is also directed to defining and/or implementing extreme ultraviolet radiation lithography (EUVL) processes. EUV radiation (also referred to as EUV light) includes radiation having a wavelength ranging from about 1 nanometer (nm) to about 100 nm. In one particular example, the EUVL uses a light with a wavelength centered at about 13.5 nm. (It is noted that throughout the present disclosure to the extent that numerical values or ranges of values are used these include deviations from the specified value within a range that would be typical of controlled parameters in the respective device fabrication step and/or system operation, as would be understood by one of ordinary skill in the art.) The method 100 may also apply however to other lithography processes having other wavelengths (e.g., deep UV (DUV) lithography processes, x-ray (e.g., soft x-ray) lithography processes) now known or later developed.

Figure 2:
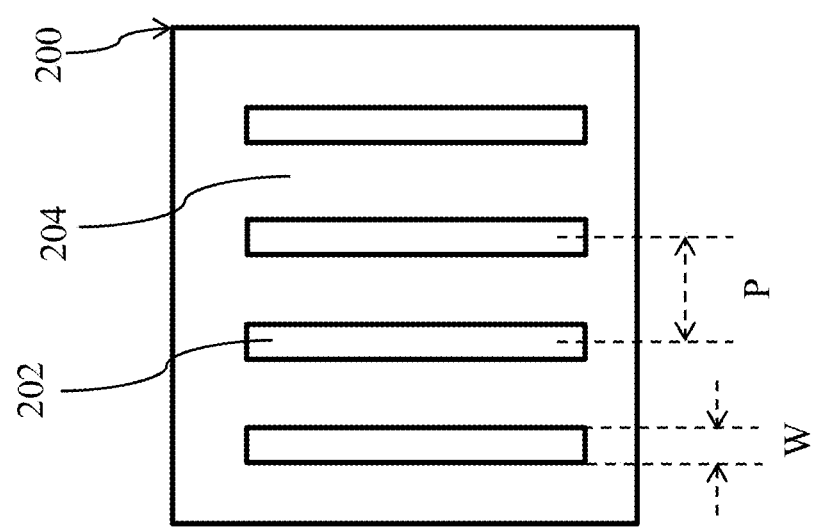
FIG. 2 is an embodiment of a schematic view of an exemplary integrated circuit pattern according to aspects of the present disclosure.

The method 100 begins at block 102 where a pattern is provided. The pattern may be a portion of an integrated circuit (IC) and include, for example, features to be formed using a single lithography process (e.g., disposed on a single mask). Referring to the example of FIG. 2, illustrated is a pattern 200 that includes a plurality of main features (main polygons) 202. The remaining region without main patterns is referred to as field 204. A main polygon is an IC feature or a portion of the IC feature, the pattern of which will be imaged to a substrate (e.g., a wafer). Exemplary main features 202 may include, for example, an opening that defines a via in a via layer (or a contact in a contact layer), interconnect lines, gate structure lines, doping profiles, active regions, mandrels or other features such as used in double patterning processes, and/or various other features typical of semiconductor devices and integrated circuits and formed on semiconductor substrates. The main features 202 have a width W and are provided at a pitch P. While the width W and pitch P appear constant in the pattern 200, this is not required. Similarly, the main features 202 are provided having a vertical orientation. In other embodiments, the main features 202 may be orthogonal, horizontal, elbow-shaped, and/or have any other configuration typical of a features of a semiconductor device.

In an embodiment, the pattern 200 is included as part of the design of an integrated circuit for example provided at logic design, physical design, place and route, and/or other stages of the IC design process. In an embodiment, the pattern 200 is presented in a data file having polygons (as illustrated), for example, GDSII file format, DFII file format, and/or other typical layout formats. In an embodiment, the pattern 200 is part of the design as defined by data preparation to form a photomask. The pattern 200 illustrates the main features 202, in the case of design data prepared for a photomask these features may have various optical proximity correction (OPC) features applied including for example, serifs, altered edges, scattering bars or other sub-resolution assist features (SRAFs) (not shown in FIG. 2). These OPC features are discussed in further detail below. In some embodiments, the pattern 200 illustrates the pattern (or portion thereof) formed onto a photomask itself as described below.

The method 100 then proceeds to block 104 where an illumination mode is selected. The illumination mode as used herein describes the configuration or position of the radiation or in other words, a spatial intensity distribution of the radiation beam in a pupil plane of the illumination system. Thus, the illumination mode may also be referred to as a configuration of a pupil. The illumination mode selected in block 104 may be an asymmetric illumination mode. Further, the asymmetric illumination may be a single pole (also referred to as a monopole) of a pupil, where the single pole is off-set from center of the pupil or in other words is asymmetric positioned.

The pupil may be the full available illumination field from the EUV radiation. Thus, the illumination mode is a determined portion of the pupil. As discussed below, the illumination mode may be provided by a controllable illumination mode selection device including elements such as, switchable mirrors, filters, zoneplates, magnetic elements, reflective elements, or other means to direct, shape and control EUV radiation. At the plane of the patterning device (e.g., mask) providing a spatial intensity distribution using a given illumination mode provides a given distribution of angles of incidence of the radiation with respect to the patterning device, which is described in detail with reference to FIG. 3.

The illumination mode is determined according to the IC pattern of the block 102 for an expected purpose that includes enhancing the intensity of the EUV light during the lithography exposure process used to expose the given pattern. Thus, the selected illumination mode of block 104 may correspond to a specific layer or portion of a layer of an IC. The method 100 may be repeated for each pattern of an IC; thus, different illumination modes may be selected and/or used for different layers of an IC and/or different patterns within an IC.

Figure 3:
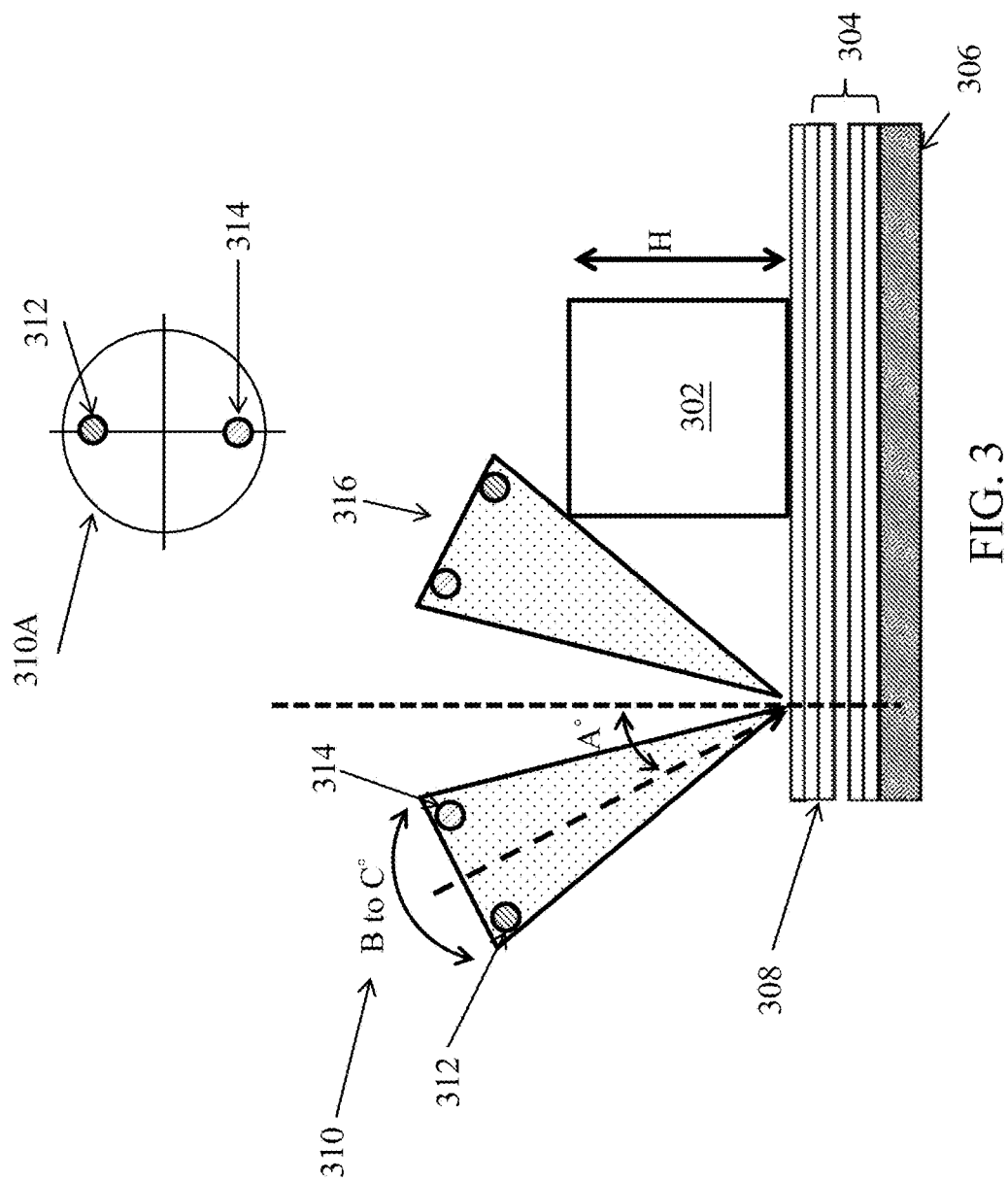
FIG. 3 is an embodiment of a diagrammatic cross-sectional view of a radiation beam incident a mask according to aspects of the present disclosure.

FIG. 3 is illustrative of a radiation 310 having a pupil illustrated as 310A. FIG. 3 illustrates the radiation 310 has an illumination mode configured as a dipole illumination mode. A first pole 312, also referred to as an up-pole, and a second pole 314, also referred to as a down-pole, are illustrated, thus providing a dipole configuration (e.g., a y-dipole configuration as it is oriented on the y-axis of pupil 310A). FIG. 3 is illustrative of the different distribution of angles of incidence on the patterning device, mask 380, between the first pole 312 and the second pole 314 of the incident radiation 310. A patterned, reflected radiation 316 is illustrated after reflection from the mask 308.

Describing the elements of FIG. 3 in further detail, FIG. 3 illustrates a patterning device for the radiation beam 310 of an EUV mask 308 (also referred to as photomask or reticle). As typical, the mask 308 includes a multi-layer film stack 304 deposited on a substrate 306. The multi-layer film stack 304 may be selected such that it provides a high reflectivity to a selected radiation type and/or wavelength to be used in the associated lithography process. In a typical example, the number of the film pairs in the multi-layer film 304 ranges from 20 to 80, however any number of film pairs is possible. As one example, about 40 to 50 alternating layers of silicon and molybdenum are typically formed on a substrate and act to reflect the radiation. Alternatively, the multi-layer film 304 may include molybdenum-beryllium (Mo/Be) film pairs, or any suitable material that is highly reflective at given wavelengths. The thickness of each layer of the multi-layer film 102a depends on the given wavelength.

The LTEM material of the substrate 306 may include $TiO_2$, doped $SiO_2$, or other low thermal expansion materials with low thermal expansion properties. A patterned film 302 may be disposed on the multi-layer film 304 in order to pattern the incident radiation beam. The patterned film 302 may provide for an absorption material and/or a phase shift material to the incident radiation relative to the reflective incident radiation from the multilayer 304. Thus, the patterned film 302 may be referred to as an absorber. The patterned film 302 may define main features, such as discussed above in FIG. 2, to be imaged onto a target substrate and define a semiconductor device or portion thereof, such as, for example, contacts, gate structures, interconnect lines, vias, and the like. The patterned film 302 may also be patterned to include sub-resolution assist features (SRAFs), such as scattering bars. In an embodiment, the film 302 is tantalum nitride, tantalum boron nitride, tellurium, tantalum boron oxide, chromium, chromium oxide, titanium nitride, tantalum, titanium, or aluminum-copper chromium, including nitrides, oxides, and alloys of each. In some embodiments, the film 302 may include multiple layers.

Each of the layers of the photomask 308 may be formed by various methods, including physical vapor deposition (PVD) process, a plating process, a chemical vapor deposition (CVD) process, ion beam deposition, spin-on coating, metal-organic decomposition (MOD), and/or other methods known in the art.

Returning to the discussion of the radiation beam, the illumination of the mask 308 may be off-axis illumination (OAI). The off-axis illumination may be defined by an angle between the mid-ray axis and a direction normal to the mask plane incident radiation 310, FIG. 3 illustrates an angle A. In an embodiment, the radiation 310 is provided at an angle A of approximately six degrees. The incident angle A may be adjusted to achieve a maximum constructive interference of the radiation reflected at each interface and a minimum absorption of the radiation by the multi-layer film 304.

While the incident angle between the mid-ray axis and the direction normal the mask is provided as A, as illustrated in FIG. 3, the full pupil actually exhibits a range of incident angles varying from B to C degrees. In an embodiment, the angles B to C range from approximately 1 degree to approximately 11 degrees. In other words, the up-pole 312 experiences an angle of incidence of approximately B with respect to the direction normal the mask 308; while the down-pole 314 experiences an angle of incidence of approximately C with respect to the direction normal to the mask 308. The angle of incidence C may be greater than the angle of incident B. With varying angles of incident, it follows that the angle of the reflected light 316 for each pole also varies. As discussed below this variation implicates pattern reproduction disparities because of the 3D effects of the photomask.

The EUV mask has a patterned (absorber) layer deposited on a stack of reflective multilayer stack that introduce mask topography effects. For a full pupil, as illustrated there are a range of angles (e.g., A, B, C), which can depend on the numerical aperture (NA) and illumination of the system centering around the angle A on the mask. The pattern of the absorber layer and its height H casts a "shadow effect," which depends on the incident angle from the illumination pupil. Using aspects of a dipole illumination mode as illustrated, the bottom pole of a dipole has a larger off-axis incidence angle, while the top pole has a small incidence angle with respect to the direction normal the mask. Due to this difference, the two poles experience very different image conditions in part due to the shadow effects of the 3D photomask features (e.g., absorber layer). As illustrated in FIG. 3, more light from the pole 312 is blocked by the absorber. Meanwhile, due to the smaller angle of the pole 314, there is less of a shadowing impact. The shadowing impact depends upon the thickness of the absorber and the oblique incidence of light. Since light from the bottom pole has a larger incident angle, more radiation is blocked by the absorber whereas radiation from the top pole has a smaller angle and thus less impact of shadowing effect. Specifically using FIG. 3 as exemplary, the absorber material 302 including its height H affect the energy of the reflected radiation beam 316. As the angle of the bottom-pole 314 and the top-pole 312 differ, the interference (e.g., shadow affect) of the absorber material 302 will impact the light from each pole 314, 312 differently.

Taking this into account, the present disclosure recognizes that different configurations of poles within a pupil provide for different reflectivity, different effects of shadowing of the 3D mask, and/or different impact on the reproducibility of the pattern defined by the photomask 308 (e.g., absorber 302). For example, the image contrast can be reduced by the 3D (shadowing) effects of the mask (e.g., absorber). Applying this, the present disclosure provides methods and systems to increase the image contrast, for example, by selective determination of an asymmetric single pole illumination mode (e.g., selecting the pole location, radius, and size) for a given pattern.

Continuing the discussion of block 104 of the method 100, the selecting an illumination mode for which to configure the pupil of the EUV radiation can include determining features of an asymmetric, single pole illumination mode. The features may include the size of the pole (diameter of the "on" portion), the radial location of the pole within the pupil, the angle from a given origin point, and/or other features of a pole of a pupil. FIGS. 4A, 4B, 4C, and 4D illustrate exemplary and non-limiting (except to the extent specifically recited in the claims that follow) embodiments of asymmetric, single pole illumination modes. Again, these illumination modes are exemplary only and the single pole may be positioned at any radius from a center of the pupil in other embodiments and at angle from a given origin point on the pupil. In FIGS. 4A, 4B, 4C, and 4D, the larger circle represents the full pupil, while the hashed dot represents the pole, including its illumination angle, radial position, and size within the pupil.

Figure 4A:
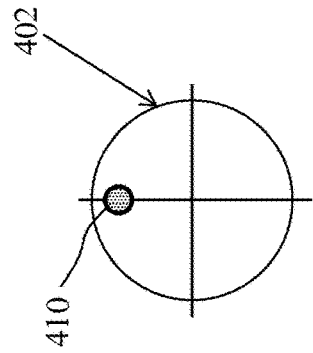
FIGS. 4A, 4B, 4C, 4D are diagrammatic top views of various exemplary embodiments of illumination modes for a pupil provided according to aspects of the present disclosure in one or more embodiment.

Referring to the example of FIG. 4A, illustrated is a pupil 400 having a single pole 408 configured asymmetrically within the pupil 400. The pole 408 is disposed at approximately 180 degrees relative to an axis defined by an origin point O of the pupil 400. The pole 408 may also be referred to as a down-pole.

In FIG. 4A, the illumination mode has the single pole 408 where the single pole 408 is the region being in an "on" state delivering light from a radiation source and the other portions of the pupil 400 are in "off" state (e.g., radiation previously blocked using appropriate mirrors, zoneplates, filters, apertures or the like). For the present example in FIG. 4A, the EUV light of the single pole 408 will be directed to a mask, while the "off" portions are not delivered. In an embodiment, the single pole 408 provides a contrast of 0.91. In an embodiment, the single pole 408 provides a normalized image log slope (NILS) of 2.88. In an embodiment, the single pole 408 provides an exposure latitude (EL) of 8.07.

Figure 4B:
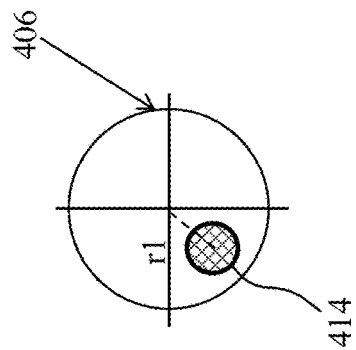

Referring to the example of FIG. 4B, illustrated is a pupil 402 having a single pole 410 configured asymmetrically within the pupil 402. The pole 410 is disposed at approximately 0 degrees relative to an axis defined by an origin point O of the pupil 402. The pole 408 may also be referred to as an up-pole.

In FIG. 4B, the illumination mode has the single pole 410 where the single pole 410 is the region being in an "on" state delivering light from a radiation source and the other portions of the pupil 402 are in "off" state (e.g., radiation previously blocked using appropriate mirrors, zoneplates, filters, apertures or the like). For the present example in FIG. 4B, the EUV light of the single pole 410 will be directed to a mask, while the "off" portions are not delivered. In an embodiment, the single pole 410 provides a contrast of 0.79. In an embodiment, the single pole 410 provides a NILS of 2.48. In an embodiment, the single pole 410 provides an EL of 6.94.

Figure 4C:
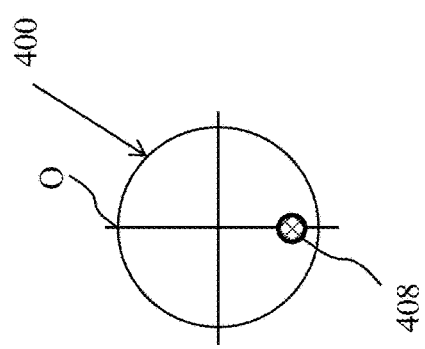

Referring to the example of FIG. 4C, illustrated is a pupil 404 having a single pole 412 configured asymmetrically within the pupil 404. The pole 412 is disposed at an angle 'a' from an origin point O of the pupil 404. In the illustrated embodiment, the angle 'a' is approximately 45 degrees relative to an axis defined by an origin point O of the pupil 404. However, in other embodiments, a single pole may be provided at other angles.

As above, in FIG. 4C, the illumination mode has the single pole 412 where the single pole 412 is the region being in an "on" state delivering light from a radiation source and the other portions of the pupil 404 are in "off" state (e.g., radiation previously blocked using appropriate mirrors, zoneplates, filters, apertures or the like). For the present example in FIG. 4C, the EUV light of the single pole 412 will be directed to a mask, while the "off" portions are not delivered.

Figure 4D:
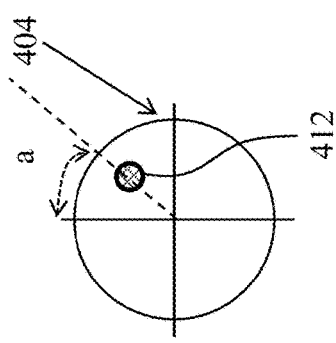

Referring to the example of FIG. 4D, illustrated is a pupil 406 having a single pole 414 configured asymmetrically within the pupil 406. The pole 414 is disposed at approximately 195 degrees relative to an axis defined by an origin point O of the pupil 400; however, in other embodiments other relative positions are possible. The pole 414 also illustrates that the pole 414 is provided at a radius 'r1' from the center-point of the pupil 406. r1 may be any value greater than 0 where the pole is still positioned within the boundaries of the pupil 406. It is noted that this same placement, at any given r1, also applies for the poles 408, 410, and 412 discussed with reference to FIGS. 4A, 4B, and 4C respectively.

In FIG. 4D, the illumination mode has the single pole 414 where the single pole 414 is the region being in an "on" state delivering light from a radiation source and the other portions of the pupil 406 are in "off" state (e.g., radiation previously blocked using appropriate mirrors, zoneplates, filters, apertures or the like). For the present example in FIG. 4D, the EUV light of the single pole 414 will be directed to a mask, while the "off" portions are not delivered. FIG. 4D illustrates that the illumination mode may also include adjusting the distribution of the radiation beam (e.g., radius of the pole). The outer and/or inner radial length of the pole ($\sigma_{outer}$ and $\sigma_{inner}$) may also vary.

The illumination mode selected in block 104 may be selected based on the pattern provided in block 102. For example, in some embodiments, the illumination mode may be known to be effective for similar pattern types. As but one example, the angle of the pole with respect to the origin point of the pupil may be selected such that it is parallel to the configuration of main features of the pattern.

The method 100 then proceeds to block 106 where a simulation is performed. The simulation provides an analysis of a degree of effective imaging of the pattern of block 102 using the selected asymmetric illumination mode of block 104. The simulation may include generating and/or analyzing an aerial image of the image contrast for the selected illumination mode. The aerial image may provide a relative image contrast in comparison with other illumination modes or configurations. This is discussed in further detail with reference to FIG. 5 below. The simulation may also provide an output of a simulated contour of the pattern, which can be compared to the design contour (e.g., pattern as defined by the design data) of the pattern. In an embodiment, a simulated contour is compared to a layout design for the pattern.

Figure 5:
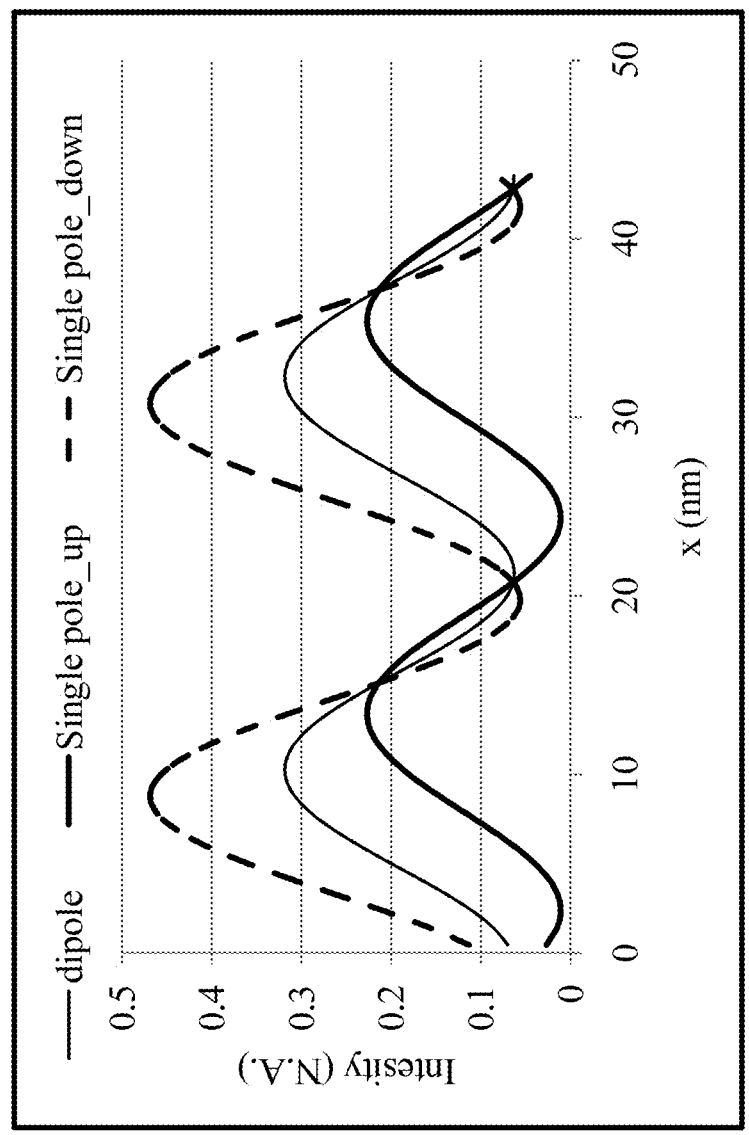
FIG. 5 is an embodiment of a graphical representation of an aerial image of respective illumination modes according to aspects of the present disclosure.

Referring to the example of FIG. 5, an aerial image 502 is illustrated having a y-axis of intensity (N.A.) and an x-axis of nanometers (nm) of the pattern position. Aerial image 502 illustrates that the single-pole exposure, for example, single pole_up (see FIG. 4A) and single pole_down (see FIG. 4B) provides a higher image contrast (NILS) than a dipole illumination configuration for the given pattern. The comparison of the aerial image may be used to select the pole configuration with the higher image contrast to be implemented in the production of the pattern at issue.

The simulation may consider the angle of incidence of the pole (off-axis illumination), see FIG. 3, with reference to the pattern of the absorber (e.g., position, height, material type) to determine the image contrast and/or effectiveness of the reproduction of the pattern.

In an embodiment of the method 100 and block 106, in addition to or in lieu of a simulation, the selection of the optimal asymmetric illumination mode is determined through analysis of test wafers subjected to exposure using the selected asymmetric illumination mode.

As discussed above, the simulation and/or test results are analyzed to determine if the asymmetric illumination provides a suitable image contrast and/or pattern reproducibility. If so, the method 100 proceeds to block 110 where the asymmetric illumination mode selected is set for the given pattern (block 102). If additional image contrast is desired, the method 100 returns to block 104 where additional and/or alternative asymmetric illumination modes are selected and analyzed in block 106 until a suitable illumination mode associated with the pattern of block 102 is determined. In some embodiments, the suitable illumination mode selected is an asymmetric, single pole illumination mode.

The method 100 then proceeds to block 112 where compensation parameters are determined and applied. The compensation parameters adjust for any disparity between the contour and position of the pattern defined by the design, and the contour and position of the pattern as produced when imaging the pattern using the selected illumination mode (e.g., using an asymmetric, single pole illumination mode).

The disparities may include [1] pattern shift, [2] best focus shift, and/or [3] defocused pattern shift. A disparity of pattern shift is a change of position of the imaged pattern in a lateral direction (displacement in the x or y direction) by any number of nanometers from the design pattern. A best focus shift is a movement in the depth (distance in the z-direction) of the optimal focal plane during the EUV exposure. A defocused pattern shift means an amount (distance) of pattern shift in an x or y direction through the defocus (e.g., off focal plane).

The compensation parameters to remedy and/or mitigate these disparities detailed above include, but are not limited to, modifications to the IC design; modifications to the design data applied after tape-out of a design including those implemented by OPC (including reticle enhancement techniques; SRAFs; scattering bars; alteration of main feature shapes, size or location; all of which are referred to herein as OPC); modifications used for design for manufacturability (DFM) techniques including design and process modifications; modifications of the device feature layout (e.g., shape or size) performed on the design data (e.g., layout file or through OPC rules or models); modifications of the processing parameters including illumination parameters such as depth of focus, dose, numerical aperture (NA). Adjustment of these compensation parameters serve to mitigate and/or eliminate the disparities experienced by the asymmetric, single pole illumination. In embodiments, adjustment of one or more of these compensation parameters address pattern shift, best focus shift, and/or defocused pattern shift.

Figure 6:
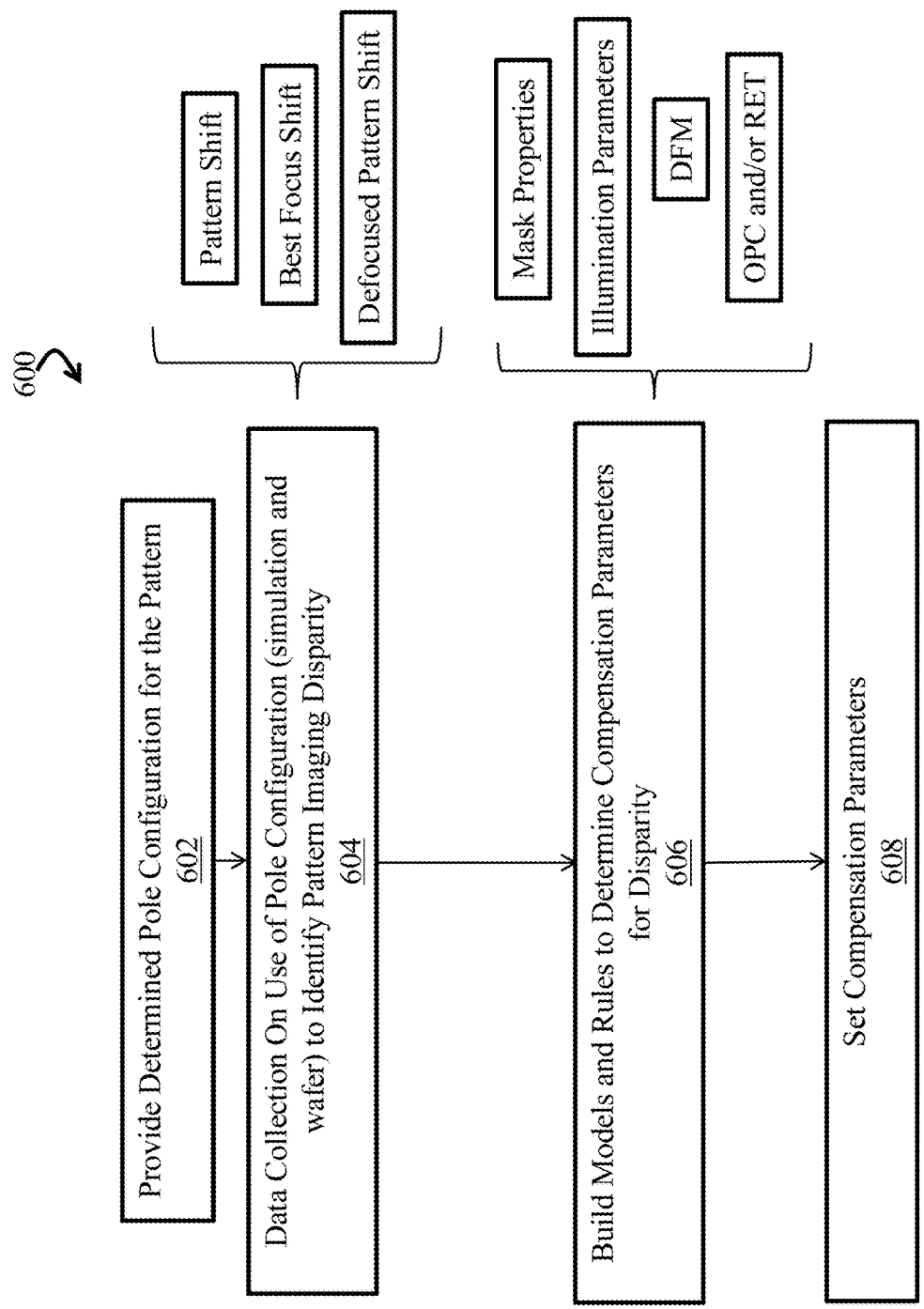
FIG. 6 is a flow chart illustrating embodiments of methods for providing compensation parameters according to one or more aspects of the present disclosure.

In embodiments, the method 100 includes determining these compensation parameters by applying models or rule based decisions on what compensation parameters are required to mitigate the disparities (e.g., pattern shift, best focus shift, defocus pattern shift). These models and rule tables may be built by collecting data from simulations and/or experimental exposures for one or more patterns. These models and rules may also include use of databases used in other processes such as optical proximity correction models and rules. FIG. 6 illustrates one embodiment of building and/or using these models and rules to determine the compensation parameters.

Thus, the method 600 of FIG. 6 illustrates in further detail one embodiment of the block 112 of the method 100 of FIG. 1. The method 600 begins at block 602 where a determined illumination mode and pole configuration is provided. Block 602 may be substantially similar to as discussed above with reference to blocks 104, 108, and/or 110 of the method 100 of FIG. 1.

The method 600 then proceeds to block 604 where an analysis of the pattern image produced using the provided illumination configuration of block 602 is performed. The analysis may include running simulations and/or test wafers in order to understand how the given pattern will be or is reproduced in imaging process(es) using the provided illumination configuration. Simulations may include inputs such as, for example, pattern configuration (e.g., feature pitch, width, orientation, density), photomask materials and configuration (e.g., absorber material and height providing shadowing effects), radiation wavelength, off-axis illumination angle, lithography parameters such as, depth of focus, and/or other typical inputs to a lithography simulation.

The analysis performed in block 604 provides for the identification of pattern imaging disparities. The disparities may include [1] pattern shift, [2] best focus shift, and/or [3] defocused pattern shift. A disparity of pattern shift is a change of position of the imaged pattern in a lateral direction (displacement in the x or y direction) by any number of nanometers from the design pattern. A best focus shift is a movement in the depth (distance in the z-direction) of the optimal focal plane during the EUV exposure. A defocused pattern shift is a change in the pattern placement during the EUV exposure with respect to an off focal plane. The disparities may be identified using simulation and/or experimental data. Some of the tools used for analysis and identification of the disparities (provided by simulation and/or experimental embodiments) are discussed below with reference to block 606 and the determination of the compensation parameters.

The method 600 then proceeds to block 606 where models and rules are built used to determine compensation parameters for the disparities identified in block 604. The rules and models applied may be generated or built by simulation data and/or experimental data. In an embodiment, rules and models are stored in a computer readable medium that provide for compensation parameters associated with each type of disparity identified for a given pattern type. The rules and models may include optical proximity correction (OPC) rules and models.

Each of the disparities is discussed below including analysis data (see FIGS. 7-10) that illustrates how data is acquired (simulation and/or experimental results) and then analyzed to build decision making tools on the compensation parameter selection—namely to build a set of models and/or rules that determine compensation parameters that compensate for the disparity for various patterns.

Pattern Shift:

In an embodiment, a disparity is identified that includes a pattern shift of a given number of nanometers in a given direction (e.g., lateral in x-direction or y-direction on the substrate). The pattern shift may be identified by simulation and/or test wafers in experimental embodiments. In an embodiment, a compensation parameter of optical proximity correction (OPC) may be used to compensate for the pattern shift. For example, the OPC rules and/or OPC models can identify the predicted pattern shift. The OPC rules and/or OPC models can compensate for an identified pattern shift (identified by OPC or other means) by shifting features (e.g., main features) on the mask itself if an opposing direction. For example, scattering bars or other SRAFs are added or modified in order to apply a shift to the pattern the desired distance in an opposite direction. Scattering bars or SRAFs are optical proximity correction (OPC) features can be used to alter the diffraction order of the radiation such that a more balanced field is produced such as discussed below with reference to FIG. 10. (Thus, the scattering bars may also serve to shift the best focus to account for a disparity of a best focus shift, discussed below.)

In an embodiment, a disparity is identified that includes a pattern shift of a given number of nanometers in a direction. In a further embodiment, a compensation parameter of providing an absorber on the photomask having a reflectivity (n) near 1 may be used to compensate and/or mitigate the pattern shift.

Figure 7:
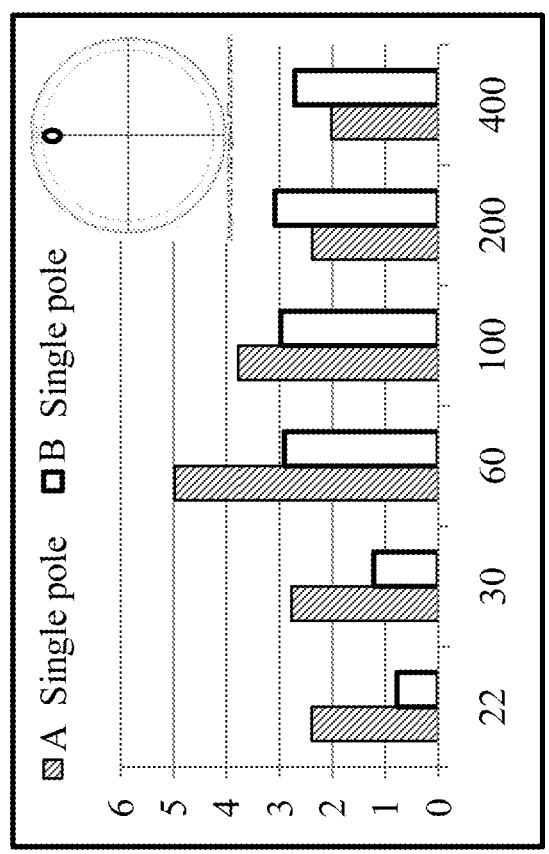
FIGS. 7, 8A, 8B, 9A, and 9B are graphical illustrations of data regarding disparity issues and/or compensation parameters of embodiments of the method of FIG. 1.

FIG. 7 illustrates the horizontal pattern shift with a single-pole illumination mode. The x-axis illustrates the pitch of main features, such as the pitch P illustrated in FIG. 2. The y-axis illustrates the shift in a first direction of a number of nanometers. Two absorber types, 'A' and 'B', are illustrated each being illuminated using radiation provided at the same illumination mode (illustrated in the pupil in the top right of FIG. 7). As illustrated in FIG. 7, the second absorber type (B) provides less shift with the same single-pole illumination. Thus, FIG. 7 illustrates that a compensation parameter may include altering or changing the absorber material on the photomask. In a further embodiment, an absorber having an n~1 provides a decreased pattern shift. In an embodiment, in FIG. 7 absorber A is TaBN and absorber B is Te.

Best Focus Shift

In an embodiment, a disparity is identified that includes a shift in the best focus plane of a given number of nanometers in the z-direction. The best focus plane shift may be identified by simulation and/or experimental lithography processes. In an embodiment, a compensation parameter of altering or modifying the absorber material type on the photomask is determined.

Figure 8B:
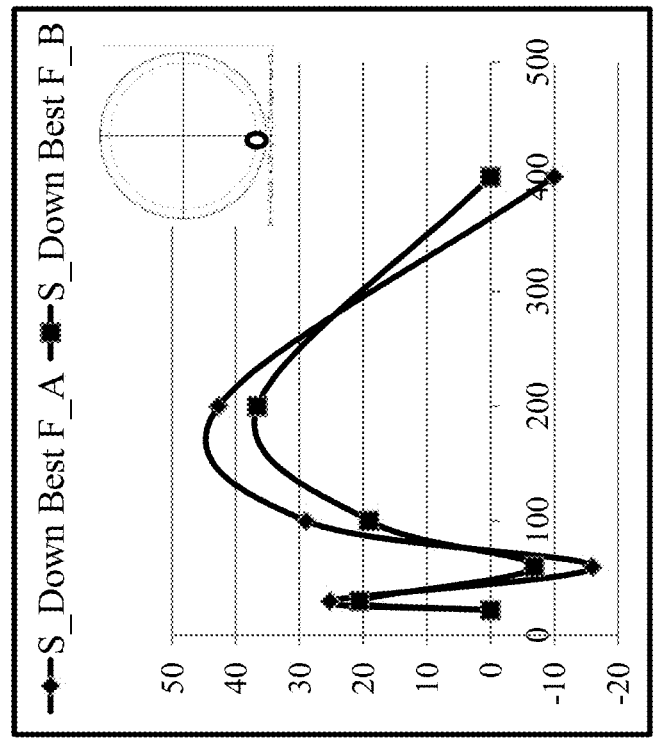
Figure 8A:
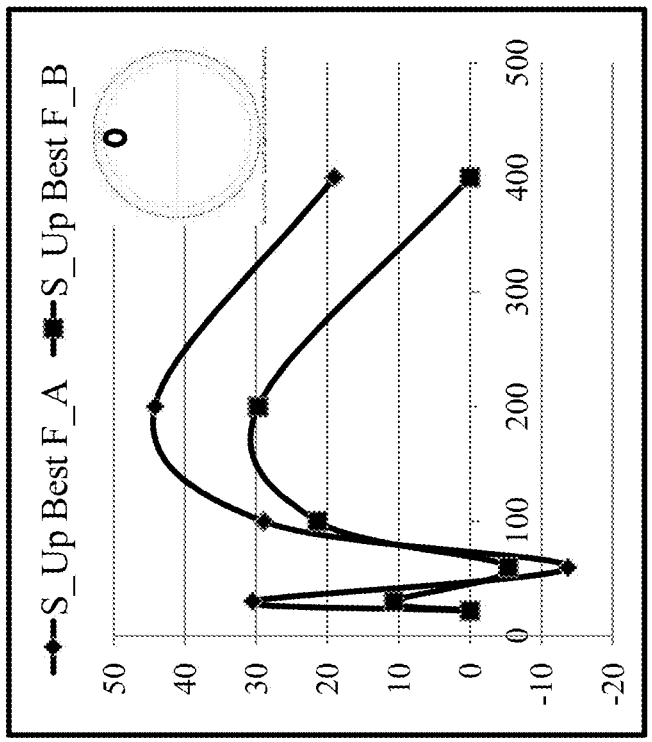

Referring to the example of FIGS. 8A and 8B, two absorber types, A and B, are illustrated each being illuminated using radiation provided at the same illumination mode (illustrated in the pupil in the top right of FIGS. 8A and 8B, which illustrate a single pole-up and single pole-down respectively). The y-axis illustrates the pitch of main features, such as pitch P (e.g., in the x-direction) illustrated in FIG. 2. The x-axis illustrates a nanometer scale of the shift of the best focus (e.g., in the z-direction). As illustrated, Absorber B (S_Up Best F_B and S_Down Best F_B) has a narrower range for best focus than Absorber B (S_Up Best F_B and S_Down Best F_B). In an embodiment, the range is narrower by approximately 10 nanometers. In an embodiment, Absorber B has a greater n value (e.g., closer to ~1). In a further embodiment, Absorber B is Te and Absorber A is TaBN. Thus, illustrating that a compensation parameter of altering or changing the absorber material is one possibility to mitigate and/or compensate for any best focus range increase generated by the single pole illumination mode.

Figure 9A:
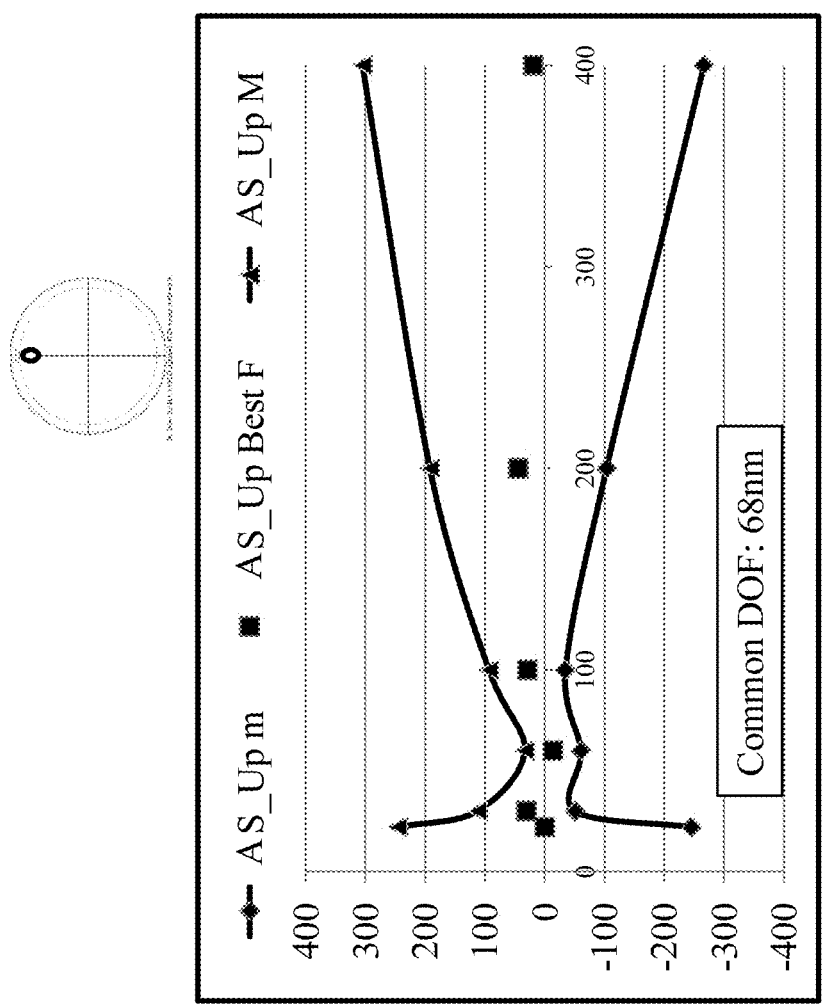
Figure 9B:
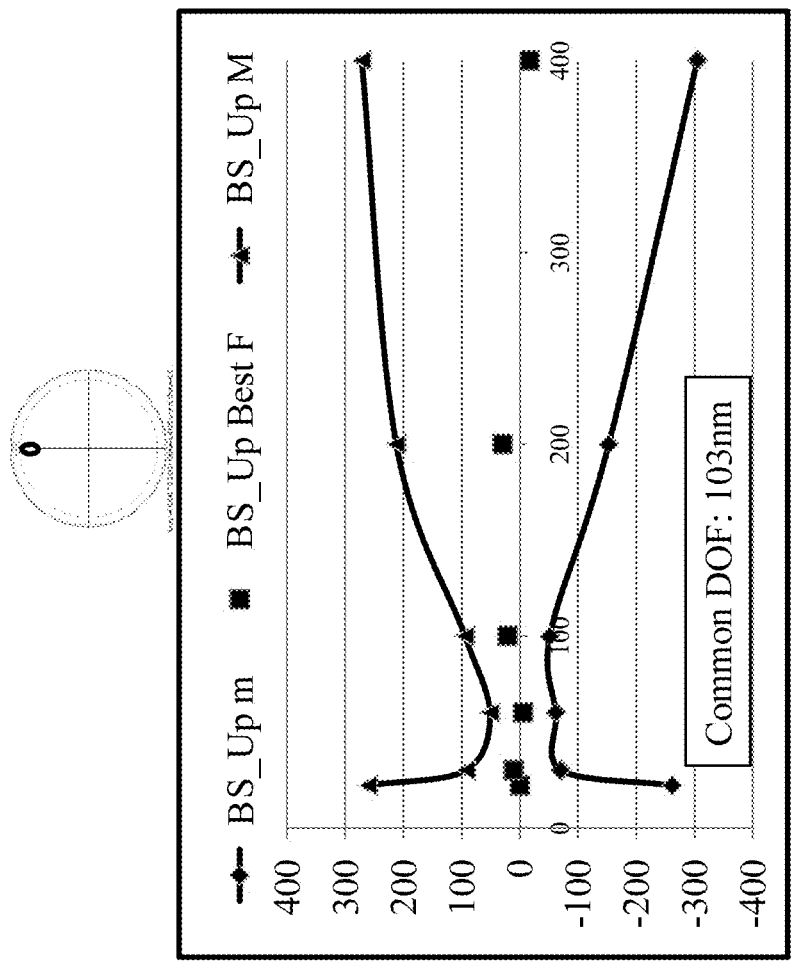

Referring now to FIGS. 9A and 9B, illustrated is a graphical representation of the best focus for a single pole illumination mode represented by the pupil in FIGS. 9A and 9B. FIGS. 9A and 9B provide a y-axis of a best focus plane in nanometers (e.g., in the z-direction) normalized to 0 and an x-axis of a pitch of main features (e.g., in the x-direction) in nanometers. FIG. 9A is directed to illumination of a photomask having an absorber A; FIG. 9B is directed to illumination of a photomask having absorber B. Data points of FIGS. 9A and 9B may be generated from experimental exposures and/or simulation and illustrated by a maximum focus plane in nanometers (A S_up M and B S_up M respectively) and a minimum focus plane in nanometers (A S_up m and B S_up m respectively). Thus, providing the range of focus planes between these two respective curves. FIGS. 9A and 9B provide for a best focus point (A S_Up Best F and B S_Up Best F respectively).

A comparison of FIGS. 9A and 9B illustrate that the absorber A and B can have a relatively small impact on the shift of the best focus. In an embodiment, Absorber B has a greater n value (e.g., closer to ~1). In a further embodiment, Absorber B is Te and Absorber A is TaBN. Thus, illustrating that a compensation parameter of altering or changing the absorber material is one possibility to mitigate and/or compensate for best focus range deviations generated by the single pole illumination mode. In an embodiment, the best focus shift does not impact the pattern imaging as a common depth of focus (DOF) is not narrower with a single-pole exposure than a dipole exposure.

In an embodiment, a disparity is identified that includes a shift in the best focus plane and a compensation parameter of providing or adjusting the OPC features such as scattering bars or other SRAFs or modification of main feature layouts is determined. As discussed below, assist features such as scattering bars can alter the diffraction orders (amplitude and/or phase) in order to compensate for shifts in best focus plane.

Best focus plane can also be shifted with different pupil design. Thus, in an embodiment, a disparity is identified that includes a shift in the best focus plane and a compensation parameter of modifying the pupil design is provided (e.g., asymmetric and/or asymmetric location modified (e.g., angle, etc.)).

Defocused Pattern Shift

In an embodiment, a disparity is identified that includes a defocused pattern shift. The defocused pattern shift may be identified by simulation and/or experimental lithography processes. In an embodiment, a compensation parameter tuning the design, process, or associated design data (e.g., OPC features) is identified and applied.

Figure 10A:
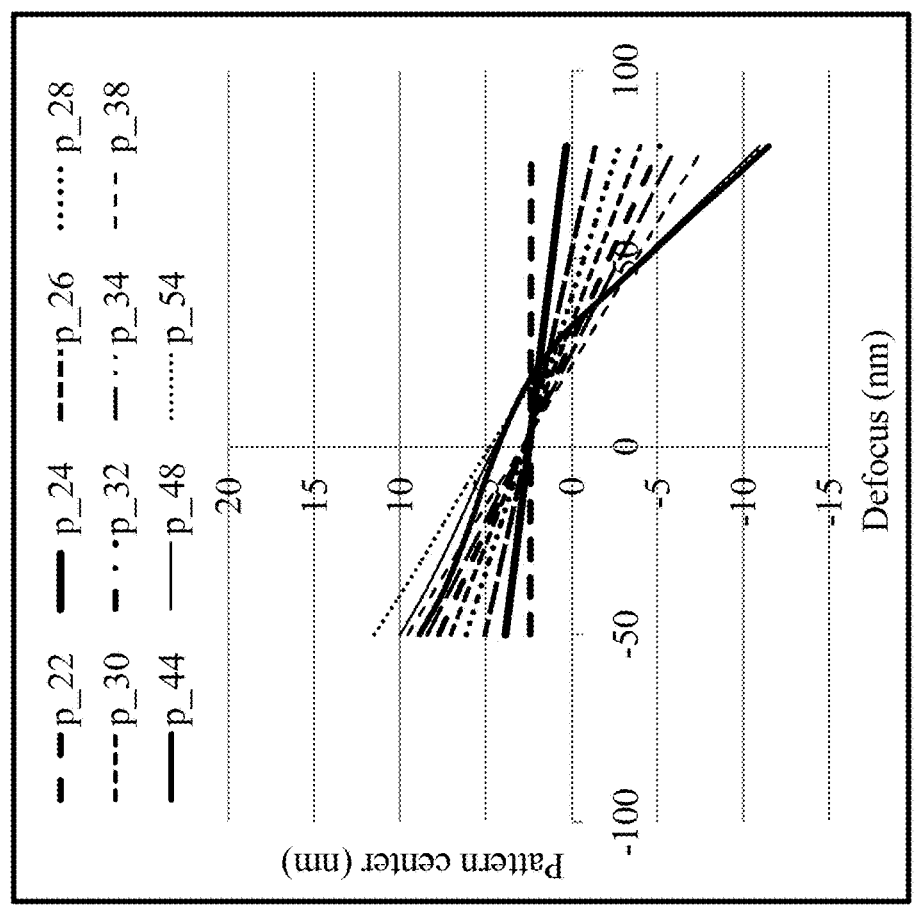
FIG. 10A is a graphical illustration of embodiments of through pitch defocus pattern shifts according to aspects of the present disclosure.

FIG. 10A illustrates through various pitches, the defocus pattern shifts. As illustrated, the shift of the pattern center in nanometers is illustrated on the y-axis; the defocus in nanometers is illustrated on the x-axis. As will be appreciated, a near-horizontal line, or a slope of near 0, is desired. In an embodiment, analysis of the data of FIG. 10A is used to alter the design of a pattern such that its pitch provides a line nearer a slope of zero. For example, a 54 nm pitch pattern can be modified to be or to be imaged to appear to be a 22 nm pitch pattern to provide a slope of near zero. In one embodiment, this modification reduces the line width of a main feature, which effectively reduces the shadow effect for IC with small feature sizes, such as feature size of 20 nm. Thus, the data analysis of FIG. 10A illustrates that a disparity in defocus pattern shift can be addressed through the use design for manufacturing and/or design alterations such as pitch modification.

Figure 10B:
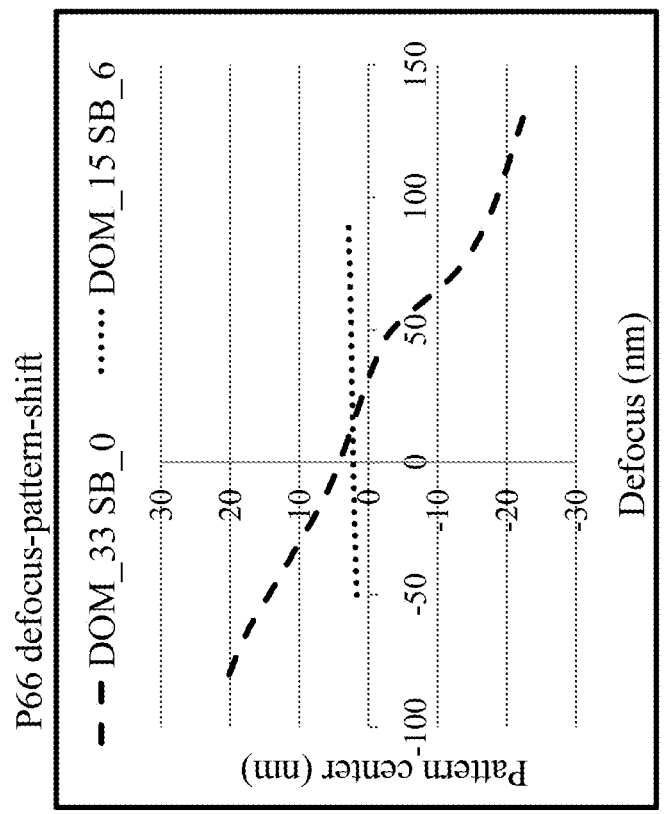
FIG. 10B is a graphical representation of an embodiment of a selected pitch defocus pattern shift according to some embodiments.

This is also illustrated by FIG. 10B which also shows the defocus plane shift in nanometers on the x-axis and the pattern center shift in nanometers on the y-axis for a given pattern pitch. In an embodiment, FIG. 10B illustrates a pattern pitch of approximately 66 nanometers. The data DOM_33 SB_0 illustrates the data set of the pattern shift of the pattern when exposing the pattern using an asymmetric, single pole without additional assist features (e.g., scattering bars). As illustrated by the data DOM_33 SB_0 a significant shift is experienced (slope is greater than 0). The data DOM_33 SB_6 illustrates the data set of the pattern shift of the pattern when exposing the pattern using the same asymmetric, single pole but with additional assist features (e.g., scattering bars). As illustrated by the data DOM_33 SB_6, no significant shift is experienced (e.g., the slope is near zero). Thus, the data analysis of FIG. 10B illustrates that a disparity in defocus pattern shift can be addressed through the use of OPC such as scattering bar placement. The placement of the scattering bars or other OPC features in the pattern of one pitch (e.g., pitch 66 (FIG. 10B)) allows the pattern to act or appear as though it has a more favorable pitch (e.g., pitch of 22 nm (see FIG. 10A)) to provide for improvement in pattern defocus shift.

Figure 10C:
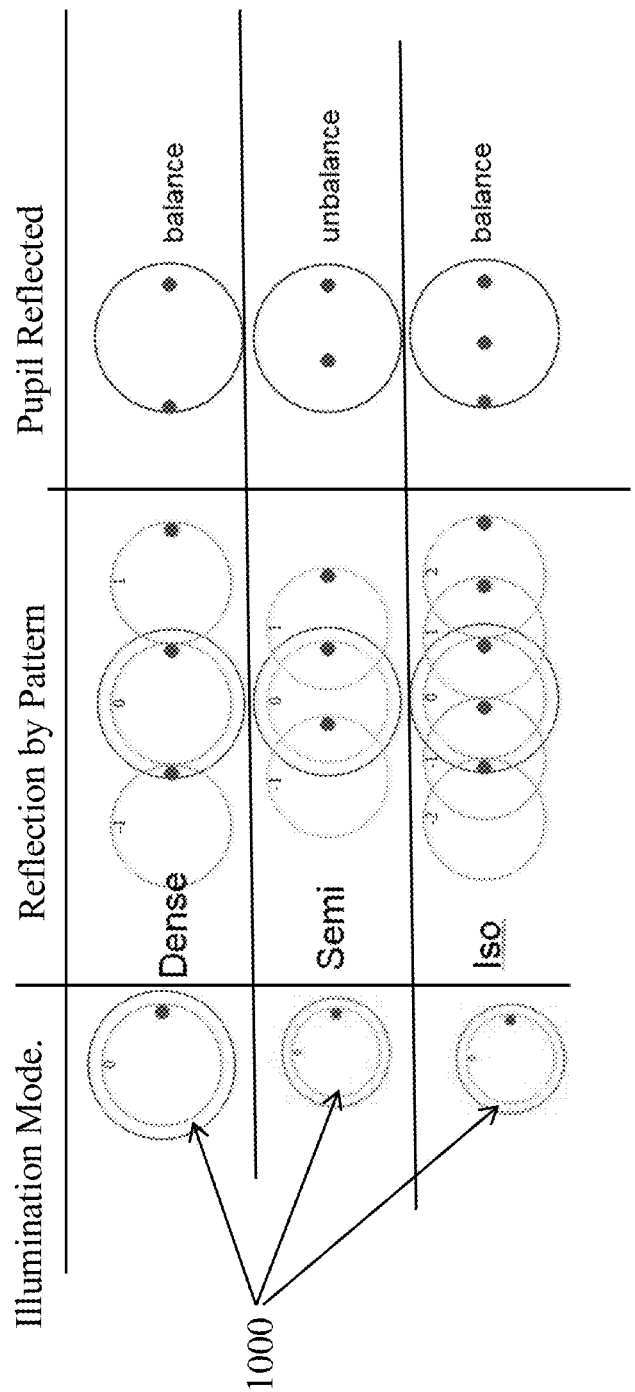
FIG. 10C is an embodiment of a table illustrating for a given pupil configuration, the reflection based on the pattern density according to some aspects of the present disclosure.
Figure 10D:
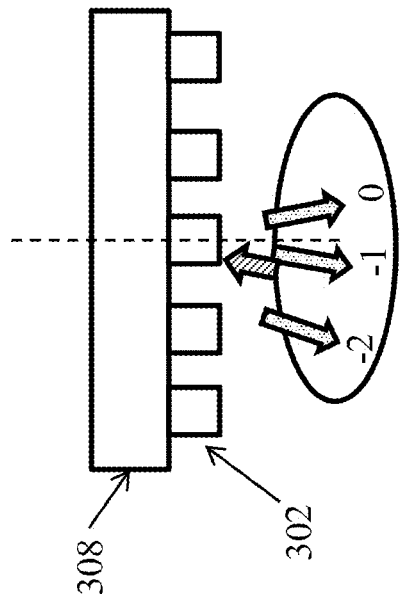
FIGS. 10D and 10E illustrate an embodiment of a compensation parameter application to alter the scattering of light according to aspects of the present disclosure.
Figure 10E:
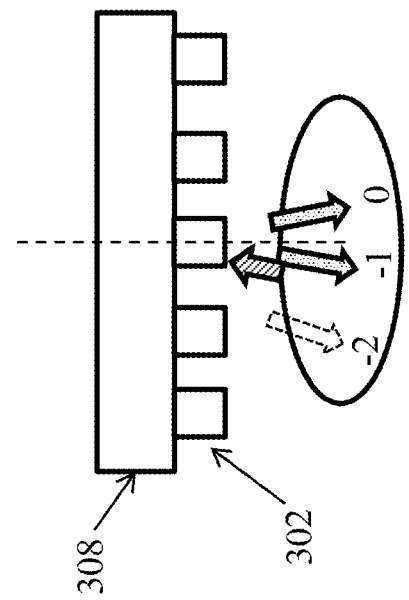

FIGS. 10C, 10D, and 10E provide another illustration of mitigating defocus pattern shifts. The table of FIG. 10C illustrates that for a given illumination mode, the reflection of the illumination mode can provide for an unbalanced scattering orders, which contributes to a defocused pattern shift. An incident ray having the given illumination mode is diffracted into various diffraction orders due to the presence of the photomask, such as such as a 0-th diffraction order ray, a −1-st diffraction order ray and a +1-st diffraction order ray, a −2-nd diffraction order ray and so forth. Because of the pattern and shadowing affects, the rays collected and provided to the substrate for exposure may be different and at times, unbalanced. The reflection by pattern and pupil reflected columns of the table of FIG. 10C illustrate that for dense patterns, semi-isolated patterns, and isolated patterns the reflected ray is different. This unbalanced scattering can give rise to a defocused pattern shift. Therefore, the density of the pattern is also considered in the rules and models built to determine the compensation parameters.

Compensation parameter can be used to mitigate the unbalanced scattering orders illustrated in the Table of FIG. 10C, such as design for manufacturability and scattering bars of other SRAFs. The design for manufacturability can provide for altering the exposure such that the second order diffraction is stronger, which compensations for the unbalance (see row two of the Table of FIG. 10C). FIG. 10D illustrates a ray incident a mask 308 having a patterned absorber layer 302, which may be substantially similar to as discussed above with reference to FIG. 3. As illustrated in FIG. 10D, which corresponds to row 2 of the Table of FIG. 10C, the $-2^{nd}$ order diffraction ray is not captured in the reflected pupil. FIG. 10E remedies this by making the $-2^{nd}$ order diffraction ray stronger such that it is captured by a collector in the exposure process. This can be accomplished by modifying the main feature (e.g., modifying the width) on the layout data and/or photomask. The main feature size, shape or spacing may be optimized to provide a greater balance to the diffraction orders. This in turn provides an improvement in "defocused pattern shift" as illustrated in FIGS. 10A-10D. For example, in FIG. 10B, tuning a line width of the main feature tuning from 33 nm to 15 nm made the slope improved from 0.2 to 0.01. Alternatively or additionally, a greater balance to the diffraction orders may be accomplished by adding scattering bars or other OPC features to the pattern to balance the diffraction. For example, the adding the scattering bar can make the DOF of line 1000 larger.

Thus, the above discussion provides for different data collected and analyzed and different compensation parameters identified and set to provide for mitigation of disparities that may arise from illumination using an asymmetric, single-pole illumination mode. This data and analysis techniques may be combined into models and/or rules that can provide for a given pattern and a given illumination mode, a determination or selection of compensation parameters to be applied, along with a value of the parameter. The models and/or rules may use this data and analysis presented in the discussion of FIGS. 6, 7, 8A, 8B, 9A, 9B, 10A, 10B, 10C, and 10D to generate models and/or rules that can be applied to a given input pattern. The models and/or rules provided in block 606 can determine the compensation parameter(s) for one or more disparities for a given pattern and can do so for any number of patterns.

The method 600 then proceeds to block 608 where the compensation parameters are set. In an embodiment, the compensation parameters may be determined and set for a given pattern or portion of an IC. As discussed above, setting the compensation parameters may include modifications to the IC design, the physical layout, the mask data (e.g., OPC), the mask materials or design, the fabrication (e.g., exposure) process parameters, and/or other knobs that impact the reproducibility of the design pattern and the imaged pattern. These compensation parameters for a given pattern may be stored in a computer readable medium and operable to apply the compensation parameters in a manufacturing setting of the pattern in any given IC design (e.g., stored as a library).

Thus, with reference to the method 600 and block 112 of the method 100, compensation parameters are selected and applied. As discussed above, in one embodiment, a disparity identified may be a pattern shift and/or a defocused pattern shift. The models and rules of FIG. 6 may be used to determine a compensation parameter by selecting the compensation parameter type of an optical proximity correction (OPC). In a further embodiment, the compensation parameter value of a number of scattering bars. The scattering bars may be selected to such that they shift the pattern in the opposite direction for a disparity of the pattern shift. Other OPC features may also be used to shift the pattern in the opposite direction including as provided by OPC rule-based or model-based programs. Additionally or alternatively, the scattering bars may be selected such that they provide for more balanced scattering of diffraction orders of the reflected radiation to address defocused pattern shift disparity. See, for example, the analysis for FIG. 10D. As also discussed above, in one embodiment, another compensation parameter identified by the rules and models to address pattern shift may be configuration of an absorber pattern on the photomask. The models and rules of FIG. 6 may be used to determine an absorber type to be applied to the photomask that can mitigate the disparity of best focus shift. The models and rules can identify a reflectivity requirement and/or a specific material.

As also discussed above, in one embodiment, a disparity identified may be a defocused pattern shift. The models and rules of FIG. 6 may be used to determine a compensation parameter by selecting the compensation parameter type of design for manufacturability. In a further embodiment, the compensation parameter value is modifying the line width of a main feature to be patterned. Additionally or alternatively, the SRAFs may be selected such that they provide for more balanced scattering of diffraction orders of the reflected radiation to address defocused pattern shift disparity. See, for example, the analysis for FIG. 10D.

As also discussed above, in one embodiment, a disparity identified may be a best focus shift. The models and rules of FIG. 6 may be used to determine an absorber type to be applied to the photomask that can mitigate the disparity of best focus shift. The models and rules can identify a reflectivity requirement and/or a specific material.

Referring again to FIG. 1, after block 112 where the compensation parameters are determined and applied including as discussed above with reference to the method 600 of FIG. 6, the method 100 proceeds to block 114 where a substrate is exposed to the pattern using the applied compensation parameters.

Block 114 includes exposure using an EUVL process having the set pupil configuration or illumination mode and the compensation parameters applied. Block 114 is discussed in further detail with respect to FIGS. 11 and 12.

Figure 11:
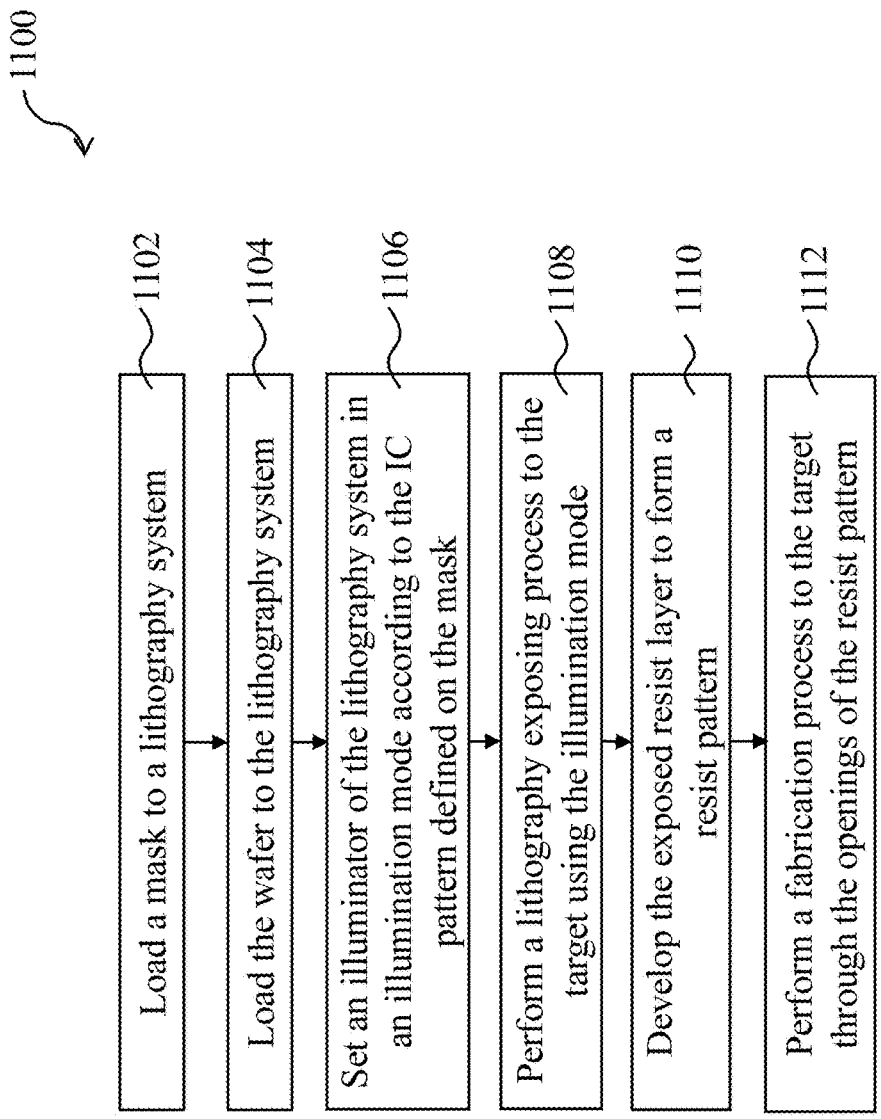
FIG. 11 is a flow chart illustrating embodiments of performing a lithography exposure process on a substrate according to aspects of the present disclosure.

FIG. 11 provides for a method 1100 of exposing a substrate. The method 1100 may provide an embodiment of the block 114 of the method 100 of FIG. 1. The method 1100 is discussed in conjunction with block diagram of FIG. 12, which illustrates an exemplary EUVL system 1200 operable to perform the steps of the method 1100.

Figure 12:
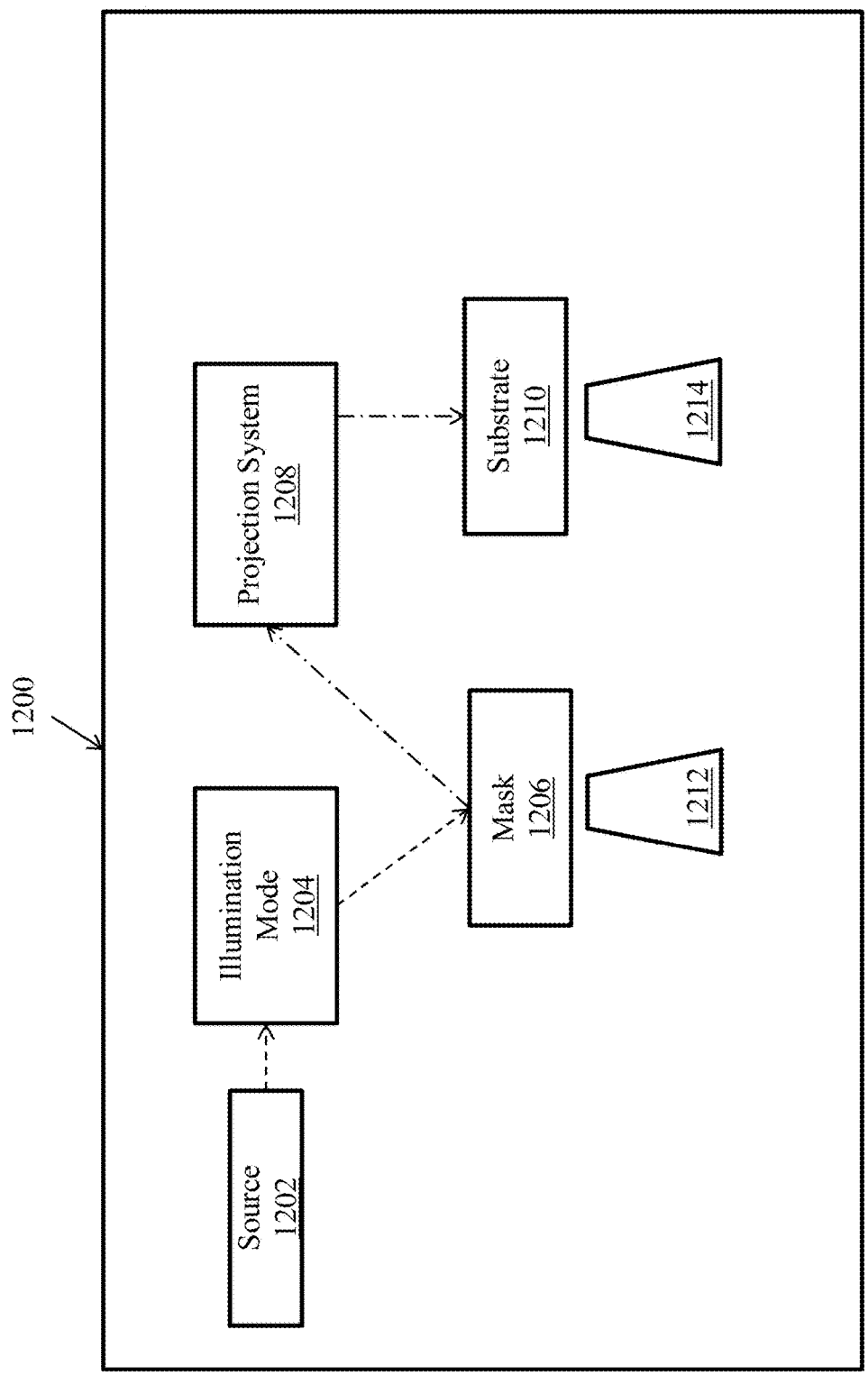
FIG. 12 is a block diagram illustrating an embodiment of a lithography system used to implement aspects of the present disclosure including those of the method of FIG. 11.

The method 1100 begins at block 1102 by loading to a lithography system with a photomask (mask or reticle). The photomask may be an EUV reticle substantially similar to as discussed above with reference to FIG. 3. The photomask may include a pattern defined as discussed above with reference to block 102 of the method 100 and the example of FIG. 2. The pattern may have certain compensation parameters applied to it including altering of a line width, applying optical proximity correct features such as scattering bars, and/or other modifications such as discussed above including with reference to FIG. 6. The lithography system may be an EUVL system an exemplary block diagram of which is provided at FIG. 12. FIG. 12 illustrates an embodiment of a lithography system 1200 for performing a lithography exposure process.

In an embodiment, the lithography system 1200 is an extreme ultraviolet (EUV) lithography system designed to expose a resist (or photoresist) layer on a substrate 1210 by EUV. The EUV lithography system 1200 employs a radiation source 1202 to generate EUV radiation (also referred to as EUV light), such as EUV light having a wavelength ranging from about 1 nm to about 100 nm. In one particular example, the EUV radiation source 1202 generates a EUV light with a wavelength centered at about 13.5 nm. Exemplary sources include, but are not limited to, converting elements such as xenon, lithium, tin into a plasma state.

The method 1100 then proceeds to block 1104 where a substrate, also referred to as a wafer, is loaded into the EUVL system. FIG. 12 illustrates a substrate 1210 in the EUVL system 1200. The substrate 1210 has a resist (or photoresist) layer disposed thereon. The resist layer is sensitive to the EUV radiation.

The method 1100 then proceeds to block 1106 where an illuminator system of the lithography system sets an illumination mode associated with an IC pattern defined on the mask. The illumination mode may be dipole illumination, annular illumination, full pupil illumination, and/or single pole illumination mode such as discussed above and including as exemplified by FIGS. 4A, 4B, 4C, 4D, for example, when implementing the method 100 of FIG. 1.

The EUV lithography system 1200 illustrates an illuminator mode system 1204. In various embodiments, the illuminator mode system 1204 includes various reflective optics, such as a single mirror or a mirror system having multiple mirrors in order to direct light from the radiation source 1202 onto a mask 1206. In the present embodiment, the illuminator 1204 is operable to configure the mirrors to provide an off-axis illumination (OAI) to illuminate the mask 1206. In embodiments, the illuminator mode system 1204 is operable to provide a desired configuration of the pupil, such as, for example, providing a single pole illumination (e.g., asymmetric), dipole illumination, annular illumination, or full pupil illumination. In some embodiments, such as discussed above, the illuminator mode system 1204 is operable to provide an asymmetrical, single pole configuration of a pupil including examples provided by FIGS. 4A, 4B, 4C, and 4D. The illumination mode system may include switchable components (e.g., mirrors) to reflect EUV light to different illumination positions, filters or apertures, and/or other means to direct the radiation.

The method 1100 then proceeds to block 1108 where an exposure process is performed on the target using the set illumination mode. The EUV lithography system 1200 also includes a mask stage 1212 configured to secure a photomask 1206 (in the present disclosure, the terms of mask, photomask, and reticle are used to refer to the same item). The mask 1206 may be a reflective mask, typical of EUV lithography such as described above with reference to FIG. 3.

The EUV lithography system 1200 also employs the projection system 1208 for imaging the pattern of the mask 1206 on to a target 1210 (such as a semiconductor wafer) secured on a substrate stage 1214 of the lithography system 1200. The projection system 1208 may have refractive optics or reflective optics. The radiation reflected from the mask 1206 (e.g., a patterned radiation) is collected by the projection system 1208.

The method 1100 then proceeds to block 1110 where a development process is performed. A developer solution may be applied to the exposed photoresist.

The method 1100 further proceeds to block 1112 where a fabrication process to the substrate through the patterned resist layer is performed. In one embodiment, the substrate or a material layer of the target is etched through the openings of the patterned resist layer, thereby transferring the IC pattern to the substrate or the underlying material layer. In furtherance of an embodiment, the underlying material layer is an interlayer dielectric (ILD) layer disposed on the semiconductor substrate. The etching process will form contacts or vias in the corresponding ILD layer. In other embodiments, etching may be used to form gate structure lines. In another embodiment, an ion implantation process is applied to the semiconductor substrate through the openings of the patterned resist layer, thereby forming doped features in the semiconductor substrate according to the IC pattern. In this case, the patterned resists layer functions as an ion implantation mask. Other patterning uses may be possible.

Various advantages may present in different embodiments of the present disclosure. In one example, the exposure intensity is enhanced and/or a higher image contrast is provided. For example in comparison to symmetric illumination modes such as dipole illumination. This can be accomplished in some embodiments by selecting a preferred single pole illumination mode. The single pole illumination may be asymmetric requiring certain compensations to be made to accurately reproduce the desired pattern. The advantages of the asymmetric illumination mode however may implicate other disparities between the imaged pattern and the desired design pattern. These disparities can be addressed through development of models and rules that identify compensation parameters that can be applied to allow for production EUV methods to be implemented using the asymmetric illumination.

Figure 13:
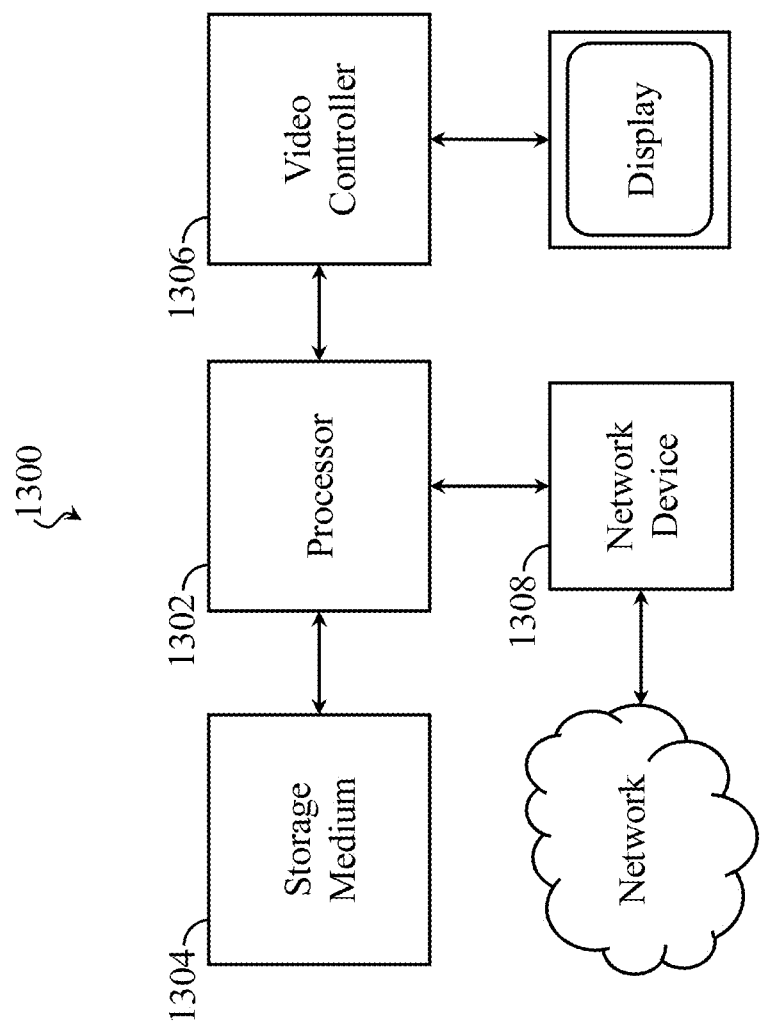
FIG. 13 is a block diagram illustrating an embodiment of a computer system used to implement aspects of the present disclosure including those of the method of FIGS. 1 and 6.

FIG. 13 is a system diagram of a computing system 1300 operable to perform the techniques and methods of the present disclosure. The computing system 1300 may include a processor 1302 such as a microcontroller or a dedicated central processing unit (CPU), a non-transitory computer-readable storage medium 1304 (e.g., a hard drive, random access memory (RAM), a compact disk read only memory (CD-ROM), etc.), a video controller 1306 such as a graphics processing unit (GPU), and a network communication device 1308 such as an Ethernet controller or wireless communication controller. In that regard, in some embodiments, the computing system 1300 is programmable and is programmed to execute processes including those associated with simulating illumination modes with respect to a given pattern, determining compensation parameters or values, and/or preparing a design database for forming a photomask. Accordingly, it is understood that any operation of the computing system 1300 according to the aspects of the present disclosure may be implemented by the computing system 1300 using corresponding instructions stored on or in a non-transitory computer readable medium accessible by the processing system. In that regard, the computing system 1300 is operable to perform one or more of the tasks described with respect to FIGS. 1 and 6, and/or generate the output of FIGS. 5, 7, 8A, 8B, 10A, 10B.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

The computer system 1300 may serve to operate and/or be coupled with the EUV lithography system 1200.

Thus, the present disclosure provides a method for extreme ultraviolet lithography (EUVL) process in some embodiments. A pattern of features of an integrated circuit is provided. A configuration of a pupil of an extreme ultraviolet wavelength radiation beam (also referred to as an illumination mode), is selected. The selected configuration is an asymmetric, single pole configuration. At least one disparity is determined between a simulated imaging using the selected configuration and a designed imaging for the pattern of features. A parameter (also referred to as a compensation parameter) is then modified to address the at least one disparity, wherein the parameter at least one a design feature, a mask feature, and a lithography process parameter. A substrate is then exposed to the pattern of features using the selected configuration and the modified parameter.

The present disclosure also provides a method in other embodiments. Embodiments include simulating an extreme ultraviolet (EUV) lithography process for a pattern of features of an integrated circuit including defining a single, asymmetrical pole illumination mode of radiation. The simulation may provide a simulated image of the pattern of features. At least one disparity is determined between the simulated image and a design of the pattern of features. The disparity may be a pattern shift, a best focus shift, and/or a defocused pattern shift. A parameter of the EUV lithography process or the pattern of features can be modified to reduce the at least one disparity.

The present disclosure also provides a method for EUVL process in one or more embodiments. The method includes selecting an illumination mode of an extreme ultraviolet wavelength radiation beam, wherein the illumination mode is an asymmetric configuration. At least one disparity is determined between a pattern exposed using the asymmetric configuration and an associated pattern defined in design data. The at least one disparity is a pattern shift, a best focus shift, or a defocus pattern shift. A compensation parameter is determined by applying at least one a model and a rule to select the compensation. The compensation parameter mitigates the at least one disparity. Thereafter, a substrate is exposed to the pattern of features using the selected illumination mode and the compensation parameter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for extreme ultraviolet lithography (EUVL) process for a semiconductor device, comprising:
   providing a pattern of features of an integrated circuit;
   selecting a configuration of a pupil of an extreme ultraviolet wavelength radiation beam, wherein the configuration is an asymmetric, single pole configuration, wherein the asymmetric, single pole configuration is a monopole of a pupil defining an illumination field of an EUV radiation, wherein the monopole is offset from a center axis of the pupil;
   using a computer system, determining at least one disparity between a simulated imaging and a designed imaging for the pattern of features;
   using the computer system, modifying a parameter to address the at least one disparity, wherein the parameter at least one a design feature, a mask feature, and a lithography process parameter; and
   using an EUVL lithography system, providing the EUV radiation to expose a substrate of the semiconductor device to the pattern of features using the selected configuration and the modified parameter.

2. The method of claim 1, wherein the selecting the configuration includes selecting the asymmetric, single pole with a higher image contrast.

3. The method of claim 1, wherein the at least one disparity is one of a pattern shift, a best focus shift and a defocused pattern shift.

4. The method of claim 1, wherein the modifying the parameter includes adjusting an optical proximity correction (OPC) feature.

5. The method of claim 4, wherein the adjusting the OPC feature includes adding a scattering bar.

6. The method of claim 1, wherein the selecting the configuration includes selecting the asymmetric, single pole configuration at a top edge of the pupil.

7. The method of claim 1, wherein the modifying the parameter includes the lithography process parameter of altering a depth of focus in the EUVL process.

8. The method of claim 1, wherein the modifying the parameter includes the design feature of changing a line width of a feature of the pattern of features.

9. The method of claim 1,
   wherein the determining the disparity includes identifying a pattern shift of a number of nanometers in a first direction, and
   wherein the modifying the parameter includes using an optical proximity correction (OPC) technique to shift the pattern the number of nanometers in a second direction.

10. A method, comprising:
    using a computer system, simulating an extreme ultraviolet (EUV) lithography process for a pattern of features of an integrated circuit, wherein the simulating includes defining a single, asymmetrical pole illumination mode of a pupil, wherein the single, asymmetrical pole is a single circular region allowing light during the EUV lithography process and wherein a center point of the single circular region is disposed a distance from a center point of the pupil, and wherein a remaining portion of the pupil has blocked light;
    determining at least one disparity between the simulating and a design of the pattern of features, wherein the at least one disparity is one of a pattern shift, a best focus shift, and a defocused pattern shift;
    modifying a parameter of the EUV lithography process or the pattern of features to reduce the at least one disparity;
    using the modified parameter and the single, asymmetrical pole illumination mode to expose the pattern of features of a semiconductor device on a substrate using an EUV lithography system.

11. The method of claim 10, wherein the modifying the parameter includes modifying a parameter of the EUV lithography process.

12. The method of claim 11, wherein the modifying is selecting a composition for an absorber layer on a photomask to be used in the EUV lithography process.

13. The method of claim 10, wherein the modifying the parameter is the parameter of the pattern of features.

14. The method of claim 13, wherein the modifying the parameter of the pattern of features includes changing a pitch of the pattern of features.

15. The method of claim 13, wherein the modifying the parameter includes:

performing an optical proximity correction (OPC) technique on the pattern of features.

16. The method of claim 15, wherein the performing the OPC technique includes adding a scattering bar to the pattern of features to make an order of diffraction a beam reflected from a mask stronger during the EUV lithography process.

17. A method of fabricating semiconductor device, comprising:
   selecting an illumination mode of an extreme ultraviolet wavelength radiation beam, wherein the illumination mode is an asymmetric configuration such that a light transferring portion of a pupil defined by an extreme ultra-violet (EUV) system is asymmetric with respect to a center point of the pupil;
   determining at least one disparity between a pattern exposed using the asymmetric configuration and an associated pattern defined in design data, wherein the at least one disparity is one of a pattern shift, a best focus shift, and a defocus pattern shift;
   using a computer system, determining a compensation parameter to mitigate the at least one disparity, wherein the determining includes applying at least one a model and a rule to select the compensation; and
   using the EUV system, exposing a substrate of the semiconductor device to the pattern of features using the selected illumination mode and the compensation parameter.

18. The method of claim 17, wherein the determining the at least one disparity includes identifying the pattern shift; and
   determining the compensation parameter includes selecting the compensation parameter type of an optical proximity correction (OPC).

19. The method of claim 17, wherein the determining the at least one disparity includes identifying the defocused pattern shift; and
   determining the compensation parameter includes selecting the compensation parameter type of an optical proximity correction (OPC) and applying sub-resolution assist features.

20. The method of claim 17, wherein the determining the at least one disparity includes identifying the pattern shift; and
   determining the compensation parameter includes modifying an absorber material on a photomask used during the exposing the substrate.

* * * * *